US012578635B2

(12) United States Patent
Lin

(10) Patent No.: US 12,578,635 B2
(45) Date of Patent: Mar. 17, 2026

(54) PELLICLE FOR AN EUV LITHOGRAPHY MASK AND A METHOD OF MANUFACTURING THEREOF

(71) Applicant: TAIWAN SEMICONDUCTOR MANUFACTURING COMPANY, LTD., Hsinchu (TW)

(72) Inventor: Yun-Yue Lin, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 263 days.

(21) Appl. No.: 18/232,674

(22) Filed: Aug. 10, 2023

(65) Prior Publication Data

US 2023/0384661 A1 Nov. 30, 2023

Related U.S. Application Data

(62) Division of application No. 17/460,130, filed on Aug. 27, 2021, now Pat. No. 12,066,755.

(51) Int. Cl.
*G03F 1/24* (2012.01)
*G03F 1/64* (2012.01)
*H01L 21/033* (2006.01)

(52) U.S. Cl.
CPC .................. *G03F 1/24* (2013.01); *G03F 1/64* (2013.01); *H01L 21/0332* (2013.01); *H01L 21/0337* (2013.01)

(58) Field of Classification Search
CPC ..... G03F 1/24; G03F 1/64; G03F 1/62; G03F 1/38; G03F 1/46; H01L 21/0332; H01L 21/0337
See application file for complete search history.

(56) References Cited

U.S. PATENT DOCUMENTS

| | | | |
|---|---|---|---|
| 8,796,666 B1 | 8/2014 | Huang et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 9,618,837 B2 | 4/2017 | Lu et al. | |
| 9,869,928 B2 | 1/2018 | Huang et al. | |
| 9,869,934 B2 | 1/2018 | Huang et al. | |
| 9,869,939 B2 | 1/2018 | Yu et al. | |
| 10,228,615 B2* | 3/2019 | Nikipelov | G03F 1/38 |
| 10,747,103 B2 | 8/2020 | Lin et al. | |

(Continued)

FOREIGN PATENT DOCUMENTS

| | | |
|---|---|---|
| CN | 103026296 A | 4/2013 |
| CN | 108738360 A | 11/2018 |

(Continued)

*Primary Examiner* — Mark F. Huff
*Assistant Examiner* — Moriah S. Smoot
(74) *Attorney, Agent, or Firm* — STUDEBAKER BRACKETT PLLC

(57) ABSTRACT
A pellicle for a reflective photo mask includes a frame, a core layer having a front surface and a rear surface, and disposed over the frame, a first capping layer disposed on the front surface of the core layer, an anti-reflection layer disposed on the first capping layer, a barrier layer disposed on the anti-reflection layer, and a heat emissive layer disposed on the barrier layer.

20 Claims, 10 Drawing Sheets

Pellicle

Mask

Black Border     Circuit Pattern

(56)        References Cited

U.S. PATENT DOCUMENTS

| | | |
|---|---|---|
| 10,859,901 B2 | 12/2020 | Nam et al. |
| 10,871,707 B2 | 12/2020 | Ikebe |
| 10,908,496 B2 | 2/2021 | Nasalevich et al. |
| 11,143,951 B2 | 10/2021 | Lin et al. |
| 11,320,731 B2 | 5/2022 | Van Zwol et al. |
| 2003/0180495 A1 | 9/2003 | Ito et al. |
| 2013/0115547 A1 | 5/2013 | Mikami et al. |
| 2018/0120692 A1* | 5/2018 | Ikebe .................... G03F 7/2004 |
| 2019/0332005 A1* | 10/2019 | Lin ........................... G03F 1/62 |
| 2020/0073230 A1* | 3/2020 | Lin ........................... G03F 1/80 |
| 2021/0325774 A1 | 10/2021 | Lin |

FOREIGN PATENT DOCUMENTS

| | | | | |
|---|---|---|---|---|
| CN | 109154771 A | 1/2019 | | |
| CN | 109765752 A | 5/2019 | | |
| EP | 3373070 A1 * | 9/2018 | .............. | G03F 1/64 |
| KR | 20190115681 A | 10/2019 | | |
| TW | 201823849 A | 7/2018 | | |
| TW | 201945833 A | 12/2019 | | |
| TW | 202010633 A | 3/2020 | | |
| WO | 2017/102379 A1 | 6/2017 | | |
| WO | 2020099072 A1 | 5/2020 | | |

* cited by examiner

S101  Forming a target layer over a substrate

S102  Forming a photo resist layer over the target layer

S103  Exposing the photo resist layer to an EUV radiation, and patterning the photo resist layer S104  Patterning the target layer

PELLICLE FOR AN EUV LITHOGRAPHY MASK AND A METHOD OF MANUFACTURING THEREOF

RELATED APPLICATION(S)

This application is a divisional of U.S. patent application Ser. No. 17/460,130 filed Aug. 27, 2021, the entire content of which is incorporated herein by reference.

BACKGROUND

A pellicle is a thin transparent film stretched over a frame structure that is glued over one side of a photo mask to protect the photo mask from damage, dust and/or moisture. In extreme ultra violet (EUV) lithography, a pellicle having high transparency in the EUV wavelength region, high mechanical strength and low thermal expansion is generally required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
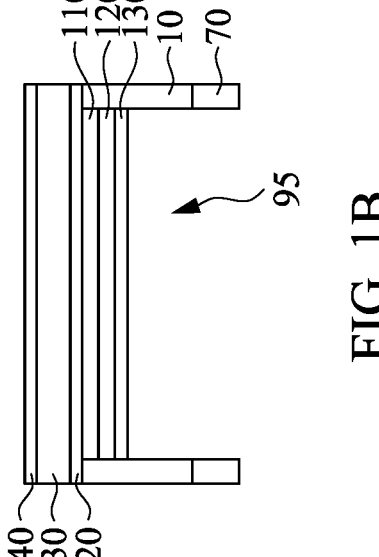
FIGS. 1A and 1B show cross sectional views of pellicles for an EUV photo mask according to embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in between the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained. In the present disclosure, a layer made of element X or a layer including element X mean that the purity of element X in the layer is more than 99 atomic %, unless otherwise defined.

A pellicle is a thin transparent film stretched over a frame structure that is glued over one side of a photo mask, and protects the photo mask from particles, dust, damage and/or contamination. A pellicle generally requires high transparency and low reflectivity. In UV or DUV lithography, the pellicle film is made of a transparent resin film. In EUV lithography, however, a resin based film is not suitable, and a non-organic material, such as a polysilicon, silicide or graphite, is used.

In the present disclosure, the pellicle for an EUV photo mask has a stacked structure of various dielectric, semiconductor and/or metallic materials to enhance EUV transmittance, to reduce EUV reflectance, to improve mechanical strength, and/or to improve thermal properties. In particular, the pellicle according to the present disclosure has an EUV transmittance higher than about 85% in some embodiments, and higher than about 87% in other embodiments, and has an EUV reflectance lower than about 0.25% in some embodiments, and lower than about % in other embodiments.

Figure 1B:
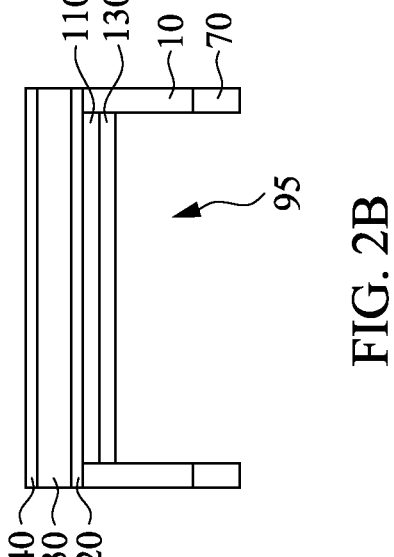

FIGS. 1A and 1B show cross sectional view of pellicles for an EUV photo mask according to embodiments of the present disclosure.

In some embodiments, as shown in FIG. 1A, a pellicle includes a frame structure 10, a core layer 30 having a front surface and a rear surface, and disposed over the frame structure a first capping layer 20 disposed on the rear surface of the core layer 30, a second capping layer 40 disposed over the front surface of the core layer 30, an anti-reflection layer 110 disposed on the second capping layer 40, a barrier layer 120 disposed on the anti-reflection layer 110, and a heat emissive layer 130 disposed on the barrier layer 120. Further, a hard mask layer 70 remains at the bottom of the frame structure 10 in some embodiments. In some embodiment, the anti-reflection layer 110, the barrier layer 120 and the heat emissive layer 130 are collectively referred to as functional layers.

In other embodiments, as shown in FIG. 1B, the anti-reflection layer 110 is disposed on the first capping layer 20, the barrier layer 120 is disposed on the anti-reflection layer 110, and the heat emissive layer 130 is disposed on the barrier layer 120, within a cavity 95 formed by the frame structure 10.

In some embodiments, the core layer 30 includes one or more layers of semiconductor material, such as Si, SiC, SiGe; metal alloys, such as a silicide (WSi, ZrSi, NiSi, TiSi, CoSi, MoSi, etc.); or dielectric material, such as silicon nitride. In some embodiments, the silicide layer is subjected to a nitridation operation or an oxidation operation to form, for example, MoSiN, ZrSiN, MoSiO or ZrSiO. The semiconductor material can be single crystalline, poly crystalline or amorphous. In some embodiments, polysilicon or amorphous silicon is used as the core layer 30. The thickness of the core layer 30 is in a range from about nm to about 50 nm in some embodiments, and is in a range from about 20 nm to about 40 nm in other embodiments.

In some embodiments, the first capping layer 20 and second capping layer 40 each include one or more layers of a dielectric material or a metallic material. In some embodiments, one or more of silicon oxide, silicon nitride, silicon oxynitride, SiC, Ni, Al, Cu, Ta, Ti, TaN or TiN are used as the capping layers. The thickness of the capping layers is in a range from about nm to about 10 nm in some embodiments and is in a range from about 2 nm to about 5 nm in other embodiments. In some embodiments, the material of the first capping layer 20 is the same as the material of the second capping layer 40, and in other embodiments, the first capping layer and the second capping layer 40 are made of different material from each other.

In some embodiments, the anti-reflection layer 110 includes Mo (purity of more than 99 atomic %) or a Mo alloy. In some embodiments, the Mo alloy is Mo nitride, Mo oxide or Mo oxynitride. The Mo alloy includes Mo and one or more of C, B, Si or P. In some embodiments, the amount of Mo in the Mo alloy is in a range from about 50 atomic % to about 99 atomic %. When the amount of Mo is smaller than the range, the anti-reflection property will be insufficient. In some embodiments, the Mo nitride, Mo oxide or Mo oxynitride further includes one or more of C, B, Si or P at an amount of 1 atomic % to about 20 atomic %. The thickness of the anti-reflection layer 110 is in a range from about 0.5 nm to about 10 nm in some embodiments and is in a range from about 1 nm to about 5 nm in other embodiments.

The heat emissive layer 130 is the uppermost layer of the pellicle and has a higher heat emissivity (heat dissipation) than the anti-reflection layer 110 to protect the pellicle from rupture, which would otherwise be caused by exposure to EUV light. In some embodiments, the heat emissive layer 130 includes Ru (purity of more than 99 atomic %) or a Ru alloy. In some embodiments, the Ru alloy includes Ru and at least one element selected from the group consisting of Ir, Nb, Zr, Ti, V, Mo, B, P and Si, where the majority of the alloy (more than 50 atomic %) is Ru. In some embodiments, the Ru alloy is represented by $Ru_{1-x}M_x$, where M is at least one selected from the group consisting of Jr, Nb, Ti, V, Mo and Zr. In some embodiments, x is greater than zero and equal to or less than 0.4. In other embodiments, x is in a range from about 0.1 to about 0.2. When the amount of M is smaller than the disclosed ranges, the Mo diffusion suppression, as explained below, will be insufficient and when the amount of M is greater than the ranges, the heat dissipation property will be decreased.

In some embodiments, the Ru alloy represented by $Ru_{1-x}M_x$ further includes at least one dopant selected from the group consisting of B, P and Si. The amount of the dopant is in a range from about 0.1 atomic % to about 10 atomic % in some embodiments, and is in a range from about 1 atomic % to about 5 atomic % in other embodiments.

In certain embodiments, the heat emissive layer 130 is made of one or more layers of RuNb, RuMo, RuV, RuTi or RuZr, with a Ru amount in a range of about 60 atomic % or more and about 99% or less.

When the anti-reflection layer 110 is made of Mo or a Mo alloy having a high Mo concentration, Mo may diffuse into the heat emissive layer 130 and may degrade properties (e.g., rupture strength) of the heat emissive layer 130 made or Ru or a Ru alloy having a high Ru concentration. In some embodiments of the present disclosure, a barrier layer 120 is disposed between the anti-reflection layer 110 and the heat emissive layer 130 to prevent or suppress the Mo diffusion into the heat emissive layer 130.

In some embodiments, the barrier layer 120 is made of a different material (different composition) than the heat emissive layer. In some embodiments, the barrier layer 120 includes a Ru alloy. In some embodiments, the Ru alloy includes Ru and at least one element selected from the group consisting of Jr, Nb, Ti, V, Mo and Zr, where the majority of the alloy (more than 50 atomic %) is Ru. In some embodiments, the Ru alloy is represented by $Ru_{1-y}M_y$, where M is at least one selected from the group consisting of Jr, Nb, Ti, V, Mo and Zr and y>x. In some embodiments, y is greater than zero and equal to or less than 0.5. The thickness of the barrier layer 120 is in a range from about 0.5 nm to about 5 nm in some embodiments and is in a range from about 1 nm to about 2 nm in other embodiments.

In some embodiments, at least one of the heat emissive layer 130 and the barrier layer 120 is a mixture of amorphous and poly crystalline.

In some embodiments, the functional layers of the pellicle include an anti-reflection layer 110 made of Mo, a barrier layer 120 made of the Ru alloy as set forth above, and a heat emissive layer 130 made of Ru. In some embodiments, the functional layers of the pellicle include an anti-reflection layer 110 made of Mo, a barrier layer 120 made of the Ru alloy as set forth above, and a heat emissive layer 130 made of the Ru alloy as set forth above. In some embodiments, the functional layers of the pellicle include an anti-reflection layer 110 made of the Mo alloy as set forth above, a barrier layer 120 made of the Ru alloy as set forth above, and a heat emissive layer 130 made of the Ru alloy as set forth above.

Figure 2A:
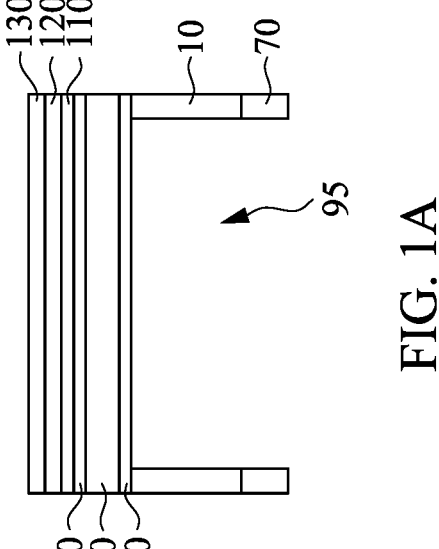
FIGS. 2A and 2B show cross sectional views of pellicles for an EUV photo mask according to embodiments of the present disclosure.
Figure 2B:
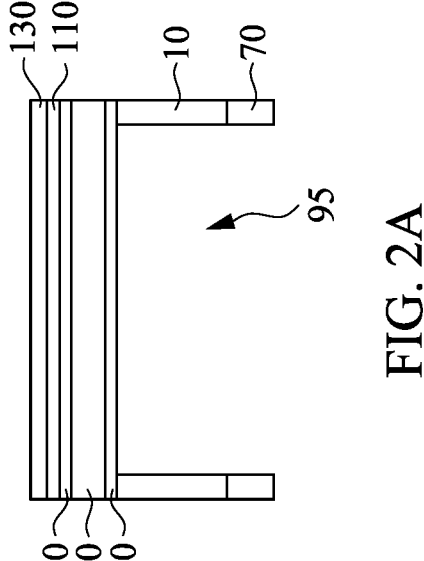

FIGS. 2A and 2B show cross sectional views of pellicles for an EUV photo mask according to embodiments of the present disclosure.

In some embodiments, no barrier layer is used and the heat emissive layer 130 is disposed directly on the anti-reflection layer 110 as shown in FIGS. 2A and 2B. In such a case, however, to prevent the Mo diffusion into the heat emissive layer 130, at least one of the anti-reflection layer or the heat emissive layer is made of a Mo alloy or a Ru alloy.

In some embodiments, the functional layers of the pellicle include an anti-reflection layer 110 made of Mo, and a heat emissive layer 130 made of the Ru alloy as set forth above. In some embodiments, the functional layers of the pellicle include an anti-reflection layer 110 made of the Mo alloy as set forth above and a heat emissive layer 130 made of Ru. In some embodiments, the functional layers of the pellicle include an anti-reflection layer 110 made of the Mo alloy as set forth above and a heat emissive layer 130 made of the Ru alloy as set forth above.

Figure 3:
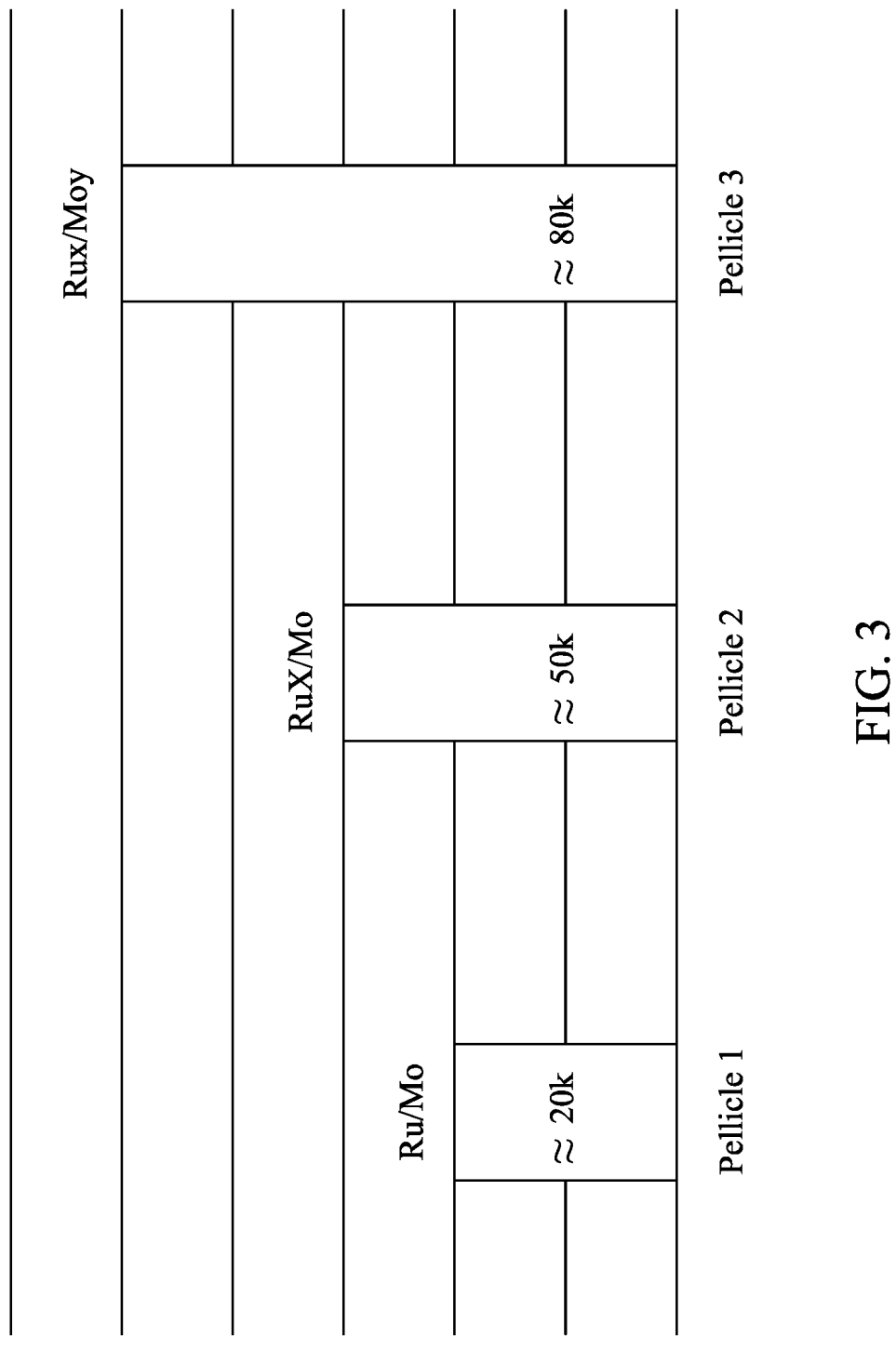
FIG. 3 show lifetimes of various pellicles according to embodiments of the present disclosure.

FIG. 3 shows the lifetimes of various pellicles according to embodiments of the present disclosure. FIG. 3 shows the number of wafers processed by an EUV lithography apparatus before replacing a pellicle to avoid destructive rupture of the pellicle. When an EUV reflective mask with a pellicle is used in an EUV lithography apparatus, the radiation of the EUV light on the pellicle causes heat generation, which degrades the pellicle strength and may cause the pellicle to rupture. Accordingly, it is necessary to periodically replace a pellicle with a new pellicle after some number of EUV exposures. In some embodiments, the life of the pellicles is defined as a number of wafers processed by using the EUV mask with the pellicle. Since a wafer includes a plurality of exposure areas, the number of exposure times on the pellicle is greater than the number of wafers processed.

When a pellicle includes no barrier layer and an anti-reflection layer made of Mo and a heat emissive layer made of Ru, the life of the pellicle is about 20,000 wafers. When a pellicle includes no barrier layer, an anti-reflection layer made of Mo and a heat emissive layer made of the Ru alloy as set forth above, the life of the pellicle increases up to about 50,000 wafers. When a pellicle includes a barrier layer made of the Ru alloy as set forth above, an anti-reflection layer made of the Mo alloy as set forth above, and a heat emissive layer made of the Ru alloy as set forth above, the life of the pellicle increases up to about 80,000 wafers. As shown in FIG. 3, the use of an alloy layer for the heat emissive layer and/or the use of a barrier layer can significantly increase the life of pellicle by preventing the Mo diffusion into the heat emissive layer.

FIGS. 4-15 show a sequential manufacturing operation for a pellicle for an EUV photo mask in accordance with an embodiment of the present disclosure. It is understood that additional operations can be provided before, during, and after processes shown by FIGS. 4-15, and some of the operations described below can be replaced or eliminated, for additional embodiments of the method. The order of the operations/processes may be interchangeable. Materials, configurations, dimensions and/or operations as explained with respect to FIGS. 1A, 1B, 2A and 2B are applied to the following embodiments, and the detailed description thereof may be omitted.

Figure 4:
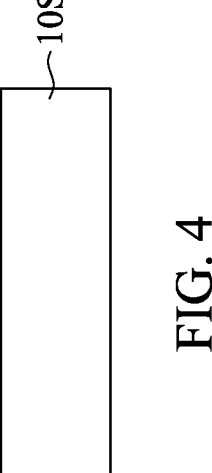
FIG. 4 shows a cross sectional view of one of the various stages for manufacturing a pellicle for an EUV photo mask in accordance with an embodiment of the present disclosure.

As shown in FIG. 4, a substrate 10S, for example a Si wafer, is prepared. The thickness of the substrate 10S is in a range from about 500 μm to about 1000 μm in some embodiments.

Figure 5:
FIG. 5 shows a cross sectional view of one of the various stages for manufacturing a pellicle for an EUV photo mask in accordance with an embodiment of the present disclosure.

On the substrate 10S, a first capping layer 20 is formed, as shown in FIG. 5. In some embodiments, the first capping layer 20 functions as an etching stop layer in a subsequent substrate etching operation. The first capping layer 20 includes one or more layers of semiconductor material, such as SiC, SiGe, SiCN, Ge, or dielectric material, such as silicon oxide, silicon nitride and silicon oxynitride, or any other suitable material. In other embodiments, the first capping layer 20 can be an amorphous or polycrystalline SiC, SiGe or Ge layer. In certain embodiments, the first capping layer 20 is silicon nitride. The thickness of the first capping layer is in a range from about 0.5 nm to about 20 nm in some embodiments, and is in a range from about 2 nm to about 5 nm in other embodiments. The first capping layer 20 can be formed by chemical vapor deposition (CVD), physical vapor deposition (PVD), atomic layer deposition (ALD), molecular beam epitaxy (MBE) and any other suitable film formation methods.

Figure 6:
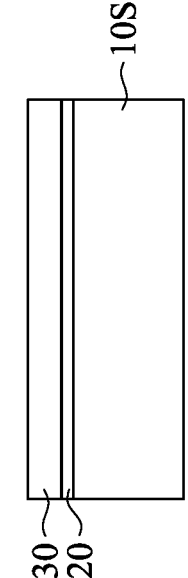
FIG. 6 shows a cross sectional view of one of the various stages for manufacturing a pellicle for an EUV photo mask in accordance with an embodiment of the present disclosure.

After the first capping layer 20 is formed, a core layer 30 is formed over the first capping layer 20, as shown in FIG. 6. The core layer 30 includes one or more layers of semiconductor material, such as Si, SiC, SiGe; metal alloys, such as a silicide (WSi, NiSi, TiSi, CoSi, MoSi, etc.); or dielectric material, such as silicon nitride. The semiconductor material can be single crystalline, poly crystalline or amorphous. In other embodiments, poly silicon or amorphous silicon is used as the core layer 30. The core layer 30 can be formed by CVD, PVD, ALD, MBE and any other suitable film formation methods.

Figure 7:
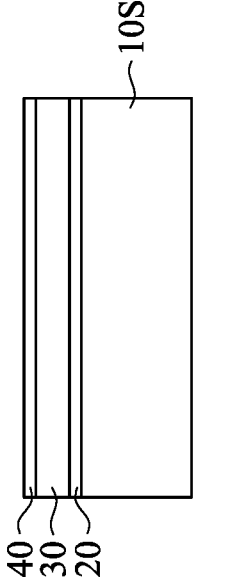
FIG. 7 shows a cross sectional view of one of the various stages for manufacturing a pellicle for an EUV photo mask in accordance with an embodiment of the present disclosure.

Then, a second capping layer 40 as a cover layer is formed over the core layer 30, as shown in FIG. 7. The second capping layer 40 includes one or more layers of silicon nitride, SiC or SiCN, in some embodiments. In other embodiments, the second capping layer 40 is formed by implanting impurities in the Si core layer. The impurities can be boron, phosphorous and/or arsenic. A dose amount of the impurities is in a range from about $10^{17}$-$10^{20}$ ions/cm$^{-2}$ in some embodiments. The thickness of the second capping layer 40 is in a range from about 0.5 nm to about 10 nm in some embodiments, and is in a range from about 2 nm to about 5 nm in other embodiments. The second capping layer 40 can be formed by CVD, PVD, ALD, MBE and any other suitable film formation methods.

Figure 8:
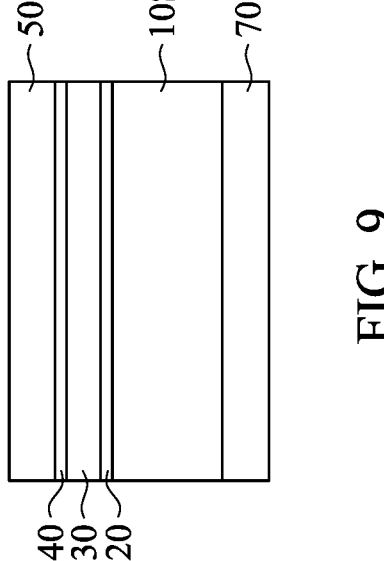
FIG. 8 shows a cross sectional view of one of the various stages for manufacturing a pellicle for an EUV photo mask in accordance with an embodiment of the present disclosure.

Next, as shown in FIG. 8, a protection layer 50 is formed over the second capping layer 40. The protection layer 50 includes one or more layers of dielectric material, such as silicon oxide, silicon nitride and silicon oxynitride. In certain embodiments, silicon oxide is used. The thickness of the protection layer 50 is in a range from about 100 nm to about 10 μm in some embodiments. The protection layer 50 can be formed by CVD, PVD, ALD, MBE and any other suitable film formation methods. The protection layer 50 includes one or more layers of metal based material, for example, Al, Cu, Ta, Ti, Co, Fe, Ni, TaN or TiN and their alloys, in some embodiments. The protection layer 50 can also be metal oxide, metal nitride, for example SiN, SiO or SiON, in some embodiments. In some embodiments, multiple layers with different materials are used as the protection layer 50.

Figure 9:
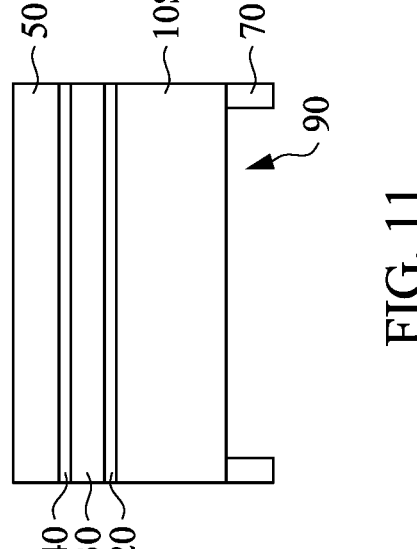
FIG. 9 shows a cross sectional view of one of the various stages for manufacturing a pellicle for an EUV photo mask in accordance with an embodiment of the present disclosure.

Next, as shown in FIG. 9, a hard mask layer 70 is formed over the back side of the substrate 10S. The hard mask layer 70 includes one or more layers of dielectric material, such as silicon oxide, silicon nitride, silicon oxynitride or SiCN. In certain embodiments, silicon nitride is used. The thickness of the hard mask layer 70 is in a range from about 100 nm to about 1000 nm in some embodiments, and is in a range from about 200 nm to about 500 nm in other embodiments. The hard mask layer 70 can be formed by CVD, PVD, ALD, MBE and any other suitable film formation methods.

Figure 10:
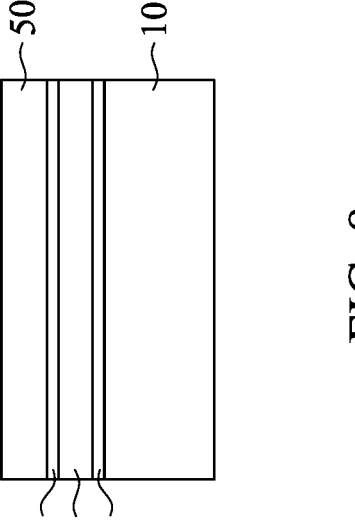
FIG. 10 shows a cross sectional view of one of the various stages for manufacturing a pellicle for an EUV photo mask in accordance with an embodiment of the present disclosure.
Figure 11:
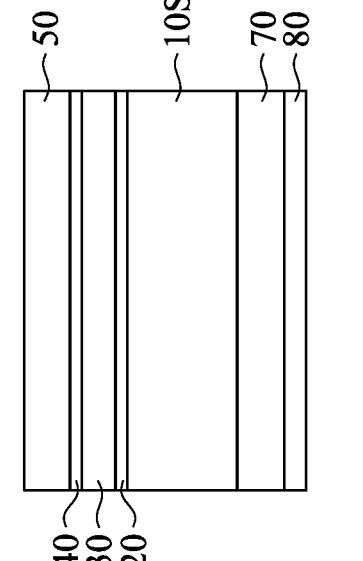
FIG. 11 shows a cross sectional view of one of the various stages for manufacturing a pellicle for an EUV photo mask in accordance with an embodiment of the present disclosure.

Then, a photo resist layer 80 is formed on the hard mask layer 70, as shown in FIG. 10. The thickness of the photo resist layer 80 is in a range from about 1 μm to about 3 μm in some embodiments, One or more lithography operations are performed to pattern the photo resist layer 80, and subsequently, the hard mask layer 70 is patterned by one or more etching operations to form a first opening 90 as shown in FIG. 11. The photo resist layer 80 is removed by suitable resist removal operations.

Figure 12:
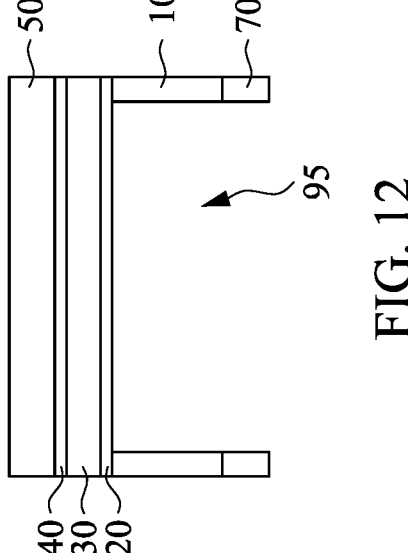
FIG. 12 shows a cross sectional view of one of the various stages for manufacturing a pellicle for an EUV photo mask in accordance with an embodiment of the present disclosure.

Then, the substrate 10S is etched to form a second opening (cavity) 95 surrounded by the frame structure 10, as shown in FIG. 12. In some embodiments, wet etching using KOH, TMAH (tetramethylammonium hydroxide) or EDP (ethylenediamine pyrocatechol) is performed to etch the Si substrate 10S. The substrate 10S can also be etched by a dry etching process using one or more of $SF_6$, $CF_4$ and $Cl_2$ gas, mixed with $N_2$ and/or $O_2$ gas. In some embodiments, the substrate below the first opening 90 is etched to expose the first capping layer 20, which functions as an etch stop layer. By this etching operation, a frame structure of the pellicle is formed by a part of the substrate 10S and a part of the hard mask layer 70. In some embodiments, no hard mask layer is used, the photo resist layer 80 is formed on the backside of the substrate 10S, and the backside of the substrate 10S is etched to form the second opening 95.

Figure 13:
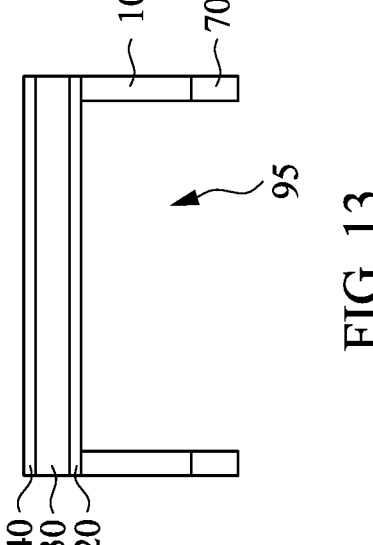
FIG. 13 shows a cross sectional view of one of the various stages for manufacturing a pellicle for an EUV photo mask in accordance with an embodiment of the present disclosure.

Then, the protection layer 50 is removed by one or more etching operations, as shown in FIG. 13. In some embodiments, a wet etching operation is used.

Figure 14:
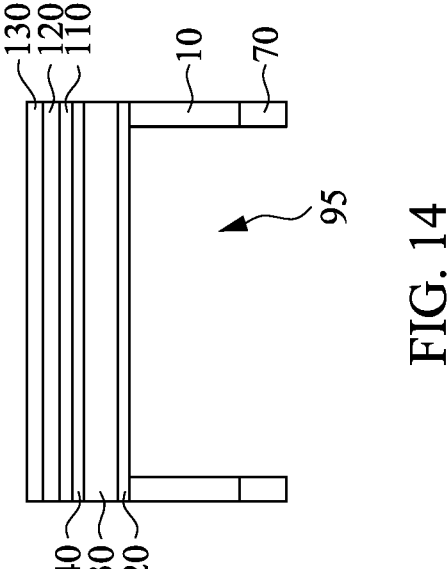
FIG. 14 shows a cross sectional view of one of the various stages for manufacturing a pellicle for an EUV photo mask in accordance with an embodiment of the present disclosure.
Figure 15:
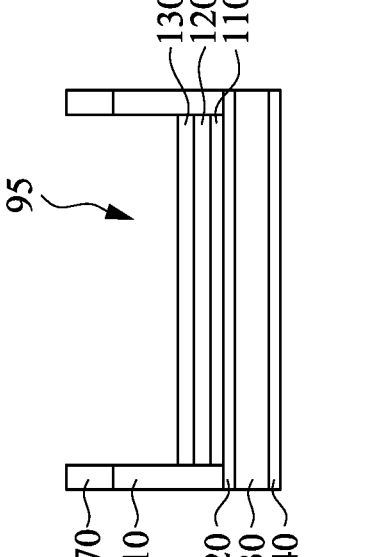
FIG. 15 shows a cross sectional view of one of the various stages for manufacturing a pellicle for an EUV photo mask in accordance with an embodiment of the present disclosure.

Next, as shown in FIG. 14, functional layers including an anti-reflection layer 110, a barrier layer 120 and a heat emissive layer 130 are sequentially formed over the second capping layer 40. In some embodiments, no barrier layer is formed, and the heat emissive layer 130 is formed directly on the anti-reflection layer 110. The functional layers 110, 120 and 130 can be respectively formed by CVD, PVD, ALD, electro plating, and any other suitable film formation methods. In some embodiments, when the functional layers are formed by sputtering, the functional layers are sequentially formed by changing sputtering targets in the same process chamber (or apparatus) without breaking vacuum. In some embodiments, the hard mask layer 70 is removed. In some embodiments, the functional layers are formed by a sputtering method at a substrate temperature of about 500° C. to about 700° C.

In other embodiments for the structures of FIGS. 1B and 2B, after the protection layer is removed, the structure shown in FIG. 13 is flipped, and the functional layers are formed on the first capping layer 20 within the second opening 95 surrounded by the frame structure 10. In some embodiments, the hard mask layer 70, on which the functional layers are deposited, is removed.

Figure 16:
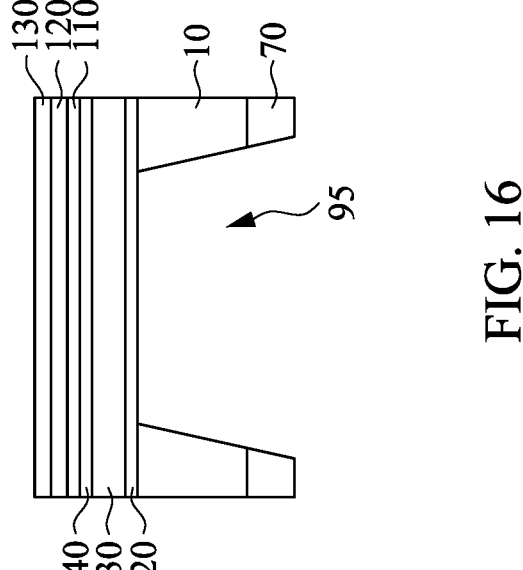
FIG. 16 shows a cross sectional view of pellicles for an EUV photo mask in accordance with another embodiment of the present disclosure.

FIG. 16 shows a cross sectional view of a pellicle for an EUV photo mask in accordance with an embodiment of the present disclosure. In this embodiment, the frame structure 10 has a tapered shape having a larger opening at the hard mask layer 70 side than at the first capping layer 20 side. The taper angle is smaller than 90 degrees and equal to or greater than 70 degrees.

Figure 17:
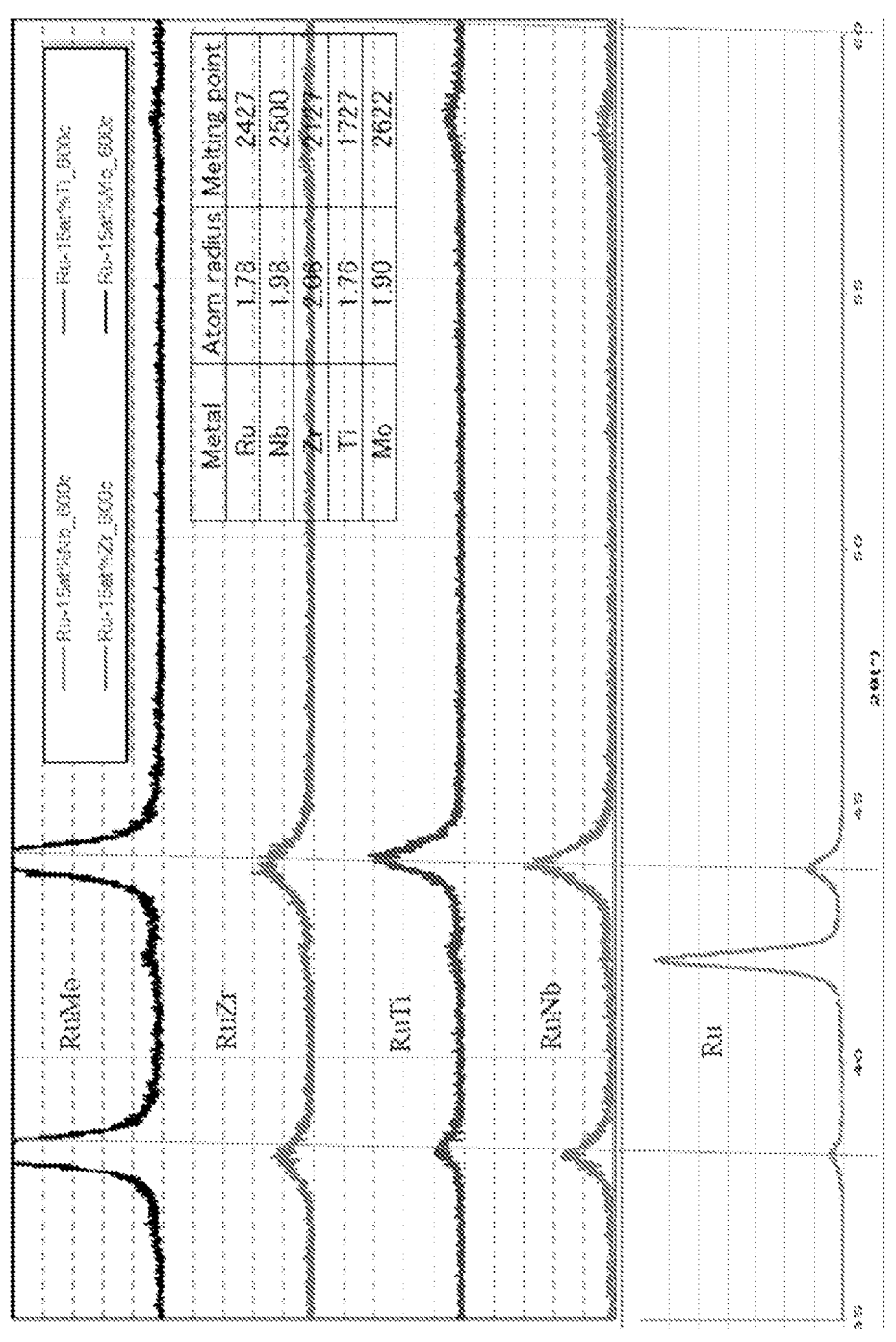
FIG. 17 shows X-ray diffraction patterns for various materials for a heat emissive layer of a pellicle in accordance with an embodiment of the present disclosure.

FIG. 17 shows X-ray diffraction patterns for various materials for a heat emissive layer of a pellicle in accordance with an embodiment of the present disclosure. When the heat emissive layer 130 is made of Ru, the Ru layer generally has a crystalline structure (poly crystalline structure) as indicated by the X-ray diffraction (XRD) pattern of FIG. 17. In contrast, when the heat emissive layer 130 is made of a Ru alloy including Ru and one of Mo, Zr, Ti or Nb in an amount of about 15 atomic %, the Ru alloy layer is a mixture of amorphous and crystalline (poly crystalline) as indicated by the XRD patterns of FIG. 17 ((101) peak is smaller than (110) and (200) peaks)). In some embodiments, the Ru alloy layer is formed at a temperature of about 600° C. By adjusting the deposition condition, it is possible to control the amount of the amorphous phase in the Ru alloy layer. In the present disclosure, by using a Ru alloy layer including amorphous and crystalline (poly crystalline) structures, it is possible to suppress Mo diffusion and to improve rupture strength and heat dissipation properties.

EUV transmittance values and reflectance values at a wavelength of 13.5 nm of a pellicle can be adjusted by selecting materials and/or thickness of the stacked structures of the pellicle. By selecting the materials and/or thicknesses of the stacked layer of an EUV pellicle, it is possible to obtain an EUV transmittance higher than about 85% in some embodiments, and higher than about 87% in other embodiments (and up to about 90%), and an EUV reflectance lower than 0.25% in some embodiments, and lower than 0.10% in other embodiments (or even smaller than 0.05% and as small as 0.01%).

Figure 18:
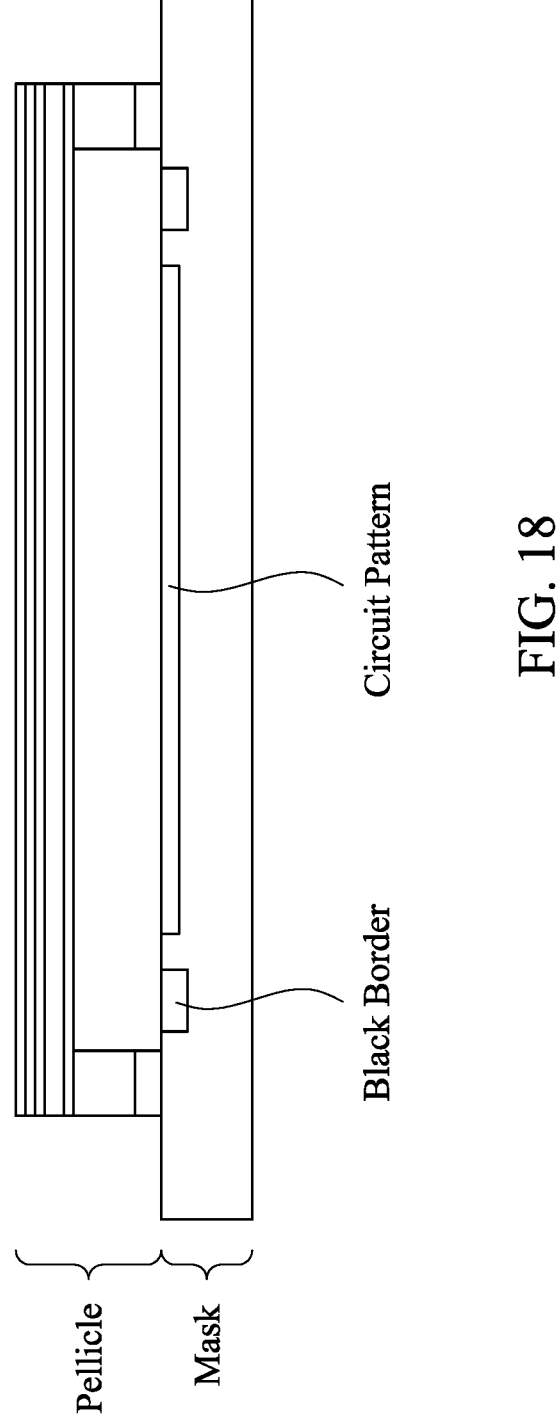
FIG. 18 shows a cross sectional view illustrating a pellicle attached to an EUV photo mask in accordance with an embodiment of the present disclosure.

FIG. 18 shows a cross sectional view illustrating a pellicle attached to an EUV photo mask in accordance with an embodiment of the present disclosure. The frame structure of the pellicle is attached to the surface of the EUV photo mask with an appropriate bonding material. The bonding material is an adhesive, such as acrylic or silicon based glue or an A-B cross link type glue. The size of the frame structure is larger than the area of black borders of the EUV photo mask so that the pellicle covers not only the circuit pattern area of the photo mask but also the black borders.

Figure 19A:
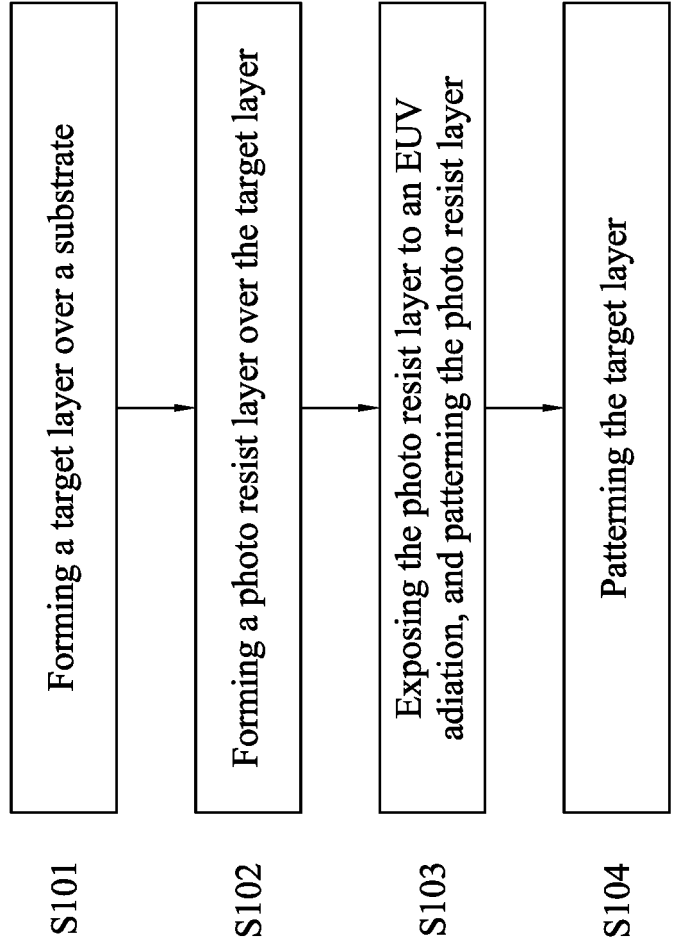
FIG. 19A shows a flowchart of a method making a semiconductor device.
Figure 19C:
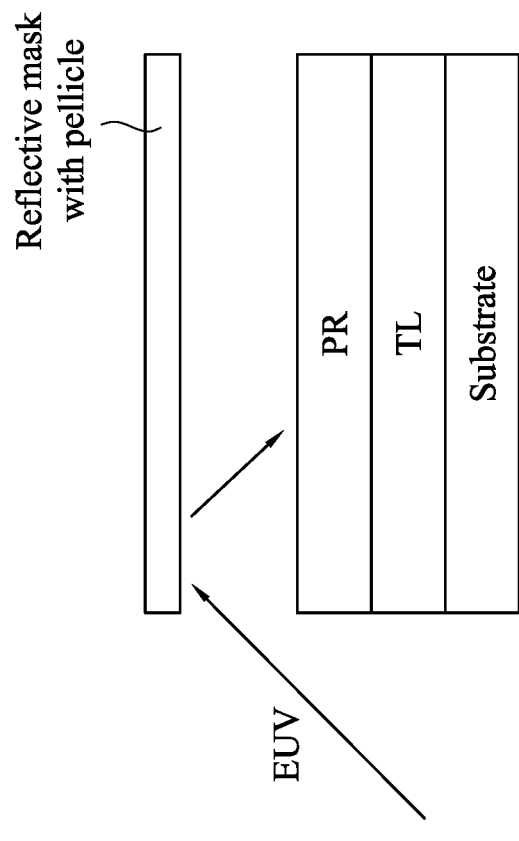
FIGS. 19B, 19C, 19D and 19E show a sequential manufacturing operation of a method of making a semiconductor device in accordance with embodiments of present disclosure.
Figure 19E:
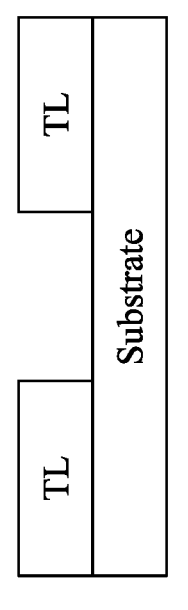
Figure 19B:
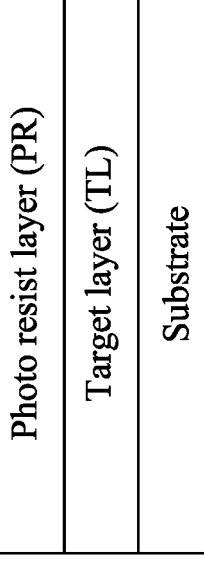

FIG. 19A shows a flowchart of a method making a semiconductor device, and FIGS. 19B, 19C, 19D and 19E show a sequential manufacturing operation of the method of making a semiconductor device in accordance with embodiments of present disclosure. A semiconductor substrate or other suitable substrate to be patterned to form an integrated circuit thereon is provided. In some embodiments, the semiconductor substrate includes silicon. Alternatively or additionally, the semiconductor substrate includes germanium, silicon germanium or other suitable semiconductor material, such as a Group III-V semiconductor material. At S101 of FIG. 19A, a target layer to be patterned is formed over the semiconductor substrate. In certain embodiments, the target layer is the semiconductor substrate. In some embodiments, the target layer includes a conductive layer, such as a metallic layer or a polysilicon layer; a dielectric layer, such as silicon oxide, silicon nitride, SiON, SiOC, SiOCN, SiCN, hafnium oxide, or aluminum oxide; or a semiconductor layer, such as an epitaxially formed semiconductor layer. In some embodiments, the target layer is formed over an underlying structure, such as isolation structures, transistors or wirings. At S102, of FIG. 19A, a photo resist layer is formed over the target layer, as shown in FIG. 19B. The photo resist layer is sensitive to the radiation from the exposing source during a subsequent photolithography exposing process. In the present embodiment, the photo resist layer is sensitive to EUV light used in the photolithography exposing process. The photo resist layer may be formed over the target layer by spin-on coating or other suitable technique. The coated photo resist layer may be further baked to drive out solvent in the photo resist layer. At S103 of FIG. 19A, the photoresist layer is patterned using an EUV reflective mask as set forth above, as shown in FIG. 19B. The patterning of the photoresist layer includes performing a photolithography exposing process by an EUV exposing system using the EUV mask. During the exposing process, the integrated circuit (IC) design pattern defined on the EUV mask is imaged to the photoresist layer to form a latent pattern thereon. The patterning of the photoresist layer further includes developing the exposed photoresist layer to form a patterned photoresist layer having one or more openings. In one embodiment where the photoresist layer is a positive tone photoresist layer, the exposed portions of the photoresist layer are removed during the developing process. The patterning of the photoresist layer may further include other process steps, such as various baking steps at different stages. For example, a post-exposure-baking (PEB) process may be implemented after the photolithography exposing process and before the developing process.

Figure 19D:
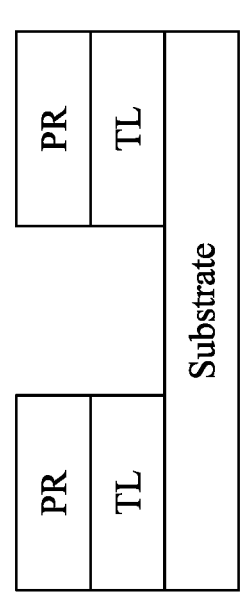

At S104 of FIG. 19A, the target layer is patterned utilizing the patterned photoresist layer as an etching mask, as shown in FIG. 19D. In some embodiments, the patterning the target layer includes applying an etching process to the target layer using the patterned photoresist layer as an etch mask. The portions of the target layer exposed within the openings of the patterned photoresist layer are etched while the remaining portions are protected from etching. Further, the patterned photoresist layer may be removed by wet stripping or plasma ashing, as shown in FIG. 19E.

In the present disclosure, functional layers of a pellicle for an EUV reflective mask include a barrier layer between an anti-reflection layer and a heat emissive layer to prevent Mo diffusion from the anti-reflection layer to the heat emissive layer. Accordingly, it is possible to increase the life of the pellicle without reducing an EUV transmittance of the pellicle. In other embodiments, even without a barrier layer, the functional layers of a pellicle include an anti-reflective layer made of a Mo alloy and/or a heat emissive layer made of a Ru alloy, which can prevent the Mo diffusion from the anti-reflection layer to the heat emissive layer. Accordingly, it is possible to increase the life of the pellicle without reducing an EUV transmittance of the pellicle. The pellicles according to embodiments of the present disclosure can provide a higher strength and thermal conductivity (dissipation) as well as higher EUV transmittance and lower EUV reflectance.

It will be understood that not all advantages have been necessarily discussed herein, no particular advantage is required for all embodiments or examples, and other embodiments or examples may offer different advantages.

In accordance with another aspect of the present disclosure, a pellicle for an EUV photo mask includes a frame, a core layer having a front surface and a rear surface, and disposed over the frame, a first capping layer disposed on the front surface of the core layer, an anti-reflection layer disposed on the first capping layer, a barrier layer disposed on the anti-reflection layer, and a heat emissive layer disposed on the barrier layer. In one or more of the foregoing and following embodiments, the heat emissive layer includes Ru and at least one selected from the group consisting of Ir, Nb, Zr, Ti, V, Mo, B, P and Si. In one or more of the foregoing and following embodiments, the heat emissive layer includes $Ru_{1-x}M_x$, where M is at least one selected from the group consisting of Ir, Nb, Ti, V, Mo and Zr. In one or more of the foregoing and following embodiments, x is greater than zero and equal to or less than 0.4. In one or more of the foregoing and following embodiments, the heat emissive layer further includes at least one selected from the group consisting of B, P and Si. In one or more of the foregoing and following embodiments, the barrier layer is made of a different material than the heat emissive layer and includes a Ru alloy. In one or more of the foregoing and following embodiments, the Ru alloy is at least one selected from the group consisting of RuIr, RuNb, RuTi, RuZr and RuV. In one or more of the foregoing and following embodiments, the barrier layer includes $Ru_{1-y}M_y$, where M is at least one selected from the group consisting of Ir, Nb, Zr, Ti, V, Mo and Zr, and y>x. In one or more of the foregoing and following embodiments, the anti-reflection layer includes Mo and at least one selected from the group consisting of C, B, Si, and P. In one or more of the foregoing and following embodiments, the pellicle further includes a second capping layer disposed on the rear surface of the core layer. In one or more of the foregoing and following embodiments, each of the first capping layer and the second capping layer includes at least one of silicon nitride or silicon carbide. In one or more of the foregoing and following embodiments, the heat emissive layer is mixture of polycrystalline and amorphous.

In accordance with another aspect of the present disclosure, a pellicle for a reflective mask includes a core layer having a front surface and a rear surface, a first capping layer disposed on the front surface of the core layer, a second capping layer disposed in the rear surface of the core layer, an anti-reflection layer disposed on the first capping layer, and a heat emissive layer disposed directly on the anti-reflection layer. The anti-reflection layer is made of a Mo alloy, and the heat emissive layer is made of a Ru alloy. In one or more of the foregoing and following embodiments, the heat emissive layer includes $Ru_{1-x}M_x$, where M is at least one selected from the group consisting of Ir, Nb, Ti, V, Mo and Zr. In one or more of the foregoing and following embodiments, x is greater than zero and equal to or less than 0.4. In one or more of the foregoing and following embodiments, the anti-reflection layer includes Mo and at least one selected from the group consisting of C, B, Si, and P. In one or more of the foregoing and following embodiments, a thickness of the heat emissive layer is in a range from 0.2 nm to 5 nm. In one or more of the foregoing and following embodiments, a thickness of the anti-reflection layer is in a range from 0.2 nm to 5 nm.

In accordance with another aspect of the present disclosure, a pellicle for a reflective mask includes a frame structure having a cavity, a first capping layer disposed on the frame, a core layer disposed on the first capping layer, a second capping layer disposed on the core layer, an anti-reflection layer disposed on the first capping layer within the cavity, a barrier layer disposed on the anti-reflection layer within the cavity, and a heat emissive layer disposed on the barrier layer within the cavity. In one or more of the foregoing and following embodiments, the anti-reflection layer is made of Mo or a Mo alloy, the heat emissive layer is made of Ru or a first Ru alloy, and the barrier layer is made of a second Ru alloy having a lower Ru concentration than the heat emissive layer.

In accordance with one aspect of the present disclosure, in a method of manufacturing a pellicle for a reflective photo mask, a first capping layer is formed over a front surface of a substrate, a core layer is formed over the first capping layer, a second capping layer is formed over the core layer, a protection layer is formed over the cover layer, a hard mask layer is formed on a back surface of the substrate, a first opening is formed in the hard mask by patterning the hard mask, a second opening is formed in the substrate by etching the substrate through the first opening, the protection layer is removed, after the protection layer is removed, an anti-reflection layer is formed on the second capping layer, a barrier layer is formed on the anti-reflection layer and a heat emissive layer is formed on the barrier layer. In one or more of the foregoing and following embodiments, the heat emissive layer includes Ru and at least one selected from the group consisting of Ir, Nb, Ti, V, Mo, Zr, B, P and Si. In one or more of the foregoing and following embodiments, the heat emissive layer includes $Ru_{1-x}M_x$, where M is at least one selected from the group consisting of Ir, Nb, Ti, V, Mo and Zr. In one or more of the foregoing and following embodiments, x is greater than zero and equal to or less than 0.4. In one or more of the foregoing and following embodiments, the heat emissive layer further includes at least one selected from the group consisting of B, P and Si. In one or more of the foregoing and following embodiments, the barrier layer is made of a different material than the heat emissive layer and includes a Ru alloy. In one or more of the foregoing and following embodiments, the Ru alloy is at least one selected from the group consisting of RuIr, RuNb, RuTi, RuZr and RuV. In one or more of the foregoing and following embodiments, the barrier layer includes $Ru_{1-y}M_y$, where M is at least one selected from the group consisting of Ir, Nb, Ti, V, Mo and Zr, and y>x. In one or more of the foregoing and following embodiments, the anti-reflection layer includes Mo and at least one selected from the group consisting of C, B, Si, and P. In one or more of the foregoing and following embodiments, each of the first capping layer and the second capping layer includes at least one of silicon nitride or silicon carbide. In one or more of the foregoing and following embodiments, the heat emissive layer is mixture of polycrystalline and amorphous.

In accordance with another aspect of the present disclosure, in a method of manufacturing a pellicle for a reflective photo mask, a first capping layer is formed over a front surface of a substrate, a core layer is formed over the first capping layer, a second capping layer is formed over the core layer, a protection layer is formed over the cover layer, a hard mask layer is formed on a back surface of the substrate, a first opening is formed in the hard mask by patterning the hard mask, a second opening is formed in the substrate by etching the substrate through the first opening, the protection layer is removed, after the protection layer is removed, an anti-reflection layer is formed on the second capping layer, and a heat emissive layer is formed directly on the anti-reflection layer. The anti-reflection layer is made of a Mo alloy, and the heat emissive layer is made of a Ru alloy. In one or more of the foregoing and following embodiments, the heat emissive layer includes $Ru_{1-x}M_x$, where M is at least one selected from the group consisting of Ir, Nb, Zr, Ti, V, Mo and Zr. In one or more of the foregoing and following embodiments, x is greater than zero and equal to or less than 0.4. In one or more of the foregoing and following embodiments, the anti-reflection layer includes Mo and at least one selected from the group consisting of C, B, Si, and P. In one or more of the foregoing and following embodiments, a thickness of the heat emissive layer is in a range from 0.2 nm to 5 nm. In one or more of the foregoing and following embodiments, a thickness of the anti-reflection layer is in a range from 0.2 nm to 5 nm.

In accordance with another aspect of the present disclosure, in a method of manufacturing a pellicle for a reflective photo mask, a first capping layer is formed over a front surface of a substrate, a core layer is formed over the first capping layer, a second capping layer is formed over the core layer, a protection layer is formed over the cover layer, a hard mask layer is formed on a back surface of the substrate, a first opening is formed in the hard mask by patterning the hard mask, a second opening is formed in the substrate by etching the substrate through the first opening, thereby exposing the first capping layer in the second opening, the protection layer is removed, after the protection layer is removed, an anti-reflection layer is formed on the first capping layer within the second opening, a barrier layer is formed on the anti-reflection layer within the second opening, and a heat emissive layer is formed on the barrier layer within the second opening. In one or more of the foregoing and following embodiments, the anti-reflection layer is made of Mo or a Mo alloy, the heat emissive layer is made of Ru or a first Ru alloy, and the barrier layer is made of a second Ru alloy having a lower Ru concentration than the heat emissive layer. In one or more of the foregoing and following embodiments, the anti-reflection layer is made of a Mo alloy, the heat emissive layer is made of a first Ru alloy, and the barrier layer is made of a second Ru alloy having a lower Ru concentration than the first Ru alloy.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of manufacturing a pellicle for a reflective photo mask, the method comprising:

forming a first capping layer over a front surface of a substrate;

forming a core layer over the first capping layer;

forming a second capping layer over the core layer;

forming a first protection layer over the second capping layer;

forming a hard mask layer on a back surface of the substrate;

forming a first opening in the hard mask layer by patterning the hard mask layer;

forming a second opening in the substrate by etching the substrate through the first opening;

removing the first protection layer;

after the first protection layer is removed, forming an anti-reflection layer on the second capping layer;

forming a barrier layer on the anti-reflection layer; and forming a heat emissive layer on the barrier layer, wherein the heat emissive layer includes $Ru_{1-x}M_x$, where M is at least one selected from the group consisting of Ir, Nb, Ti, V, Mo and Zr, and wherein the barrier layer is made of a different material than the heat emissive layer and includes a Ru alloy.

2. The method of claim 1, wherein x is greater than zero and equal to or less than 0.4.

3. The method of claim 1, wherein the heat emissive layer further includes at least one selected from the group consisting of B, P and Si.

4. The method of claim 1, wherein the Ru alloy is at least one selected from the group consisting of RuIr, RuNb, RuTi, RuZr and RuV.

5. The method of claim 1, wherein the barrier layer includes $Ru_{1-y}M_y$, where M is at least one selected from the group consisting of Ir, Nb, Ti, V, Mo and Zr, and y>x.

6. The method of claim 1, wherein the anti-reflection layer includes Mo and at least one selected from the group consisting of C, B, Si, and P.

7. The method of claim 1, wherein each of the first capping layer and the second capping layer includes at least one of silicon nitride or silicon carbide.

8. The method of claim 1, wherein the heat emissive layer is a mixture of polycrystalline and amorphous material.

9. A method of manufacturing a pellicle for a reflective photo mask, the method comprising:

forming a first capping layer over a front surface of a substrate;

forming a core layer over the first capping layer;

forming a second capping layer over the core layer;

forming a first protection layer over the second capping layer;

forming a hard mask layer on a back surface of the substrate;

forming a first opening in the hard mask layer by patterning the hard mask layer;

forming a second opening in the substrate by etching the substrate through the first opening;

removing the first protection layer;

after the first protection layer is removed, forming an anti-reflection layer on the second capping layer; and a heat emissive layer directly on the anti-reflection layer, wherein:

the anti-reflection layer is made of a Mo alloy, and the heat emissive layer is made of a Ru alloy.

10. The method of claim 9, wherein the heat emissive layer includes $Ru_{1-x}M_x$, where M is at least one selected from the group consisting of Ir, Nb, Ti, V, Mo and Zr.

11. The method of claim 10, wherein x is greater than zero and equal to or less than 0.4.

12. The method of claim 9, wherein the anti-reflection layer includes Mo and at least one selected from the group consisting of C, B, Si, and P.

13. The method of claim 9, wherein a thickness of the heat emissive layer is in a range from 0.2 nm to 5 nm.

14. The method of claim 9, wherein a thickness of the anti-reflection layer is in a range from 0.2 nm to 5 nm.

15. A method of manufacturing a pellicle for a reflective photo mask, the method comprising:

forming a first capping layer over a front surface of a substrate;

forming a core layer over the first capping layer;

forming a second capping layer over the core layer;

forming a first protection layer over the second capping layer;

forming a hard mask layer on a back surface of the substrate;

forming a first opening in the hard mask layer by patterning the hard mask layer;

forming a second opening in the substrate by etching the substrate through the first opening, thereby exposing the first capping layer in the second opening;

removing the first protection layer;

after the first protection layer is removed, forming an anti-reflection layer on the first capping layer within the second opening;

forming a barrier layer on the anti-reflection layer within the second opening; and forming a heat emissive layer on the barrier layer within the second opening, the anti-reflection layer is made of Mo or a Mo alloy, the heat emissive layer is made of Ru or a first Ru alloy, and the barrier layer is made of a second Ru alloy having a lower Ru concentration than the heat emissive layer.

16. The method of claim 15, wherein the heat emissive layer is a mixture of polycrystalline and amorphous material.

17. The method of claim 15, wherein the heat emissive layer further includes at least one selected from the group consisting of B, P, and Si.

18. The method of claim 15, wherein the first capping layer and the second capping layer include at least one of silicon nitride or silicon carbide.

19. The method of claim 9, wherein the heat emissive layer is a mixture of polycrystalline and amorphous material.

20. The method of claim 9, wherein the first capping layer and the second capping layer include at least one of silicon nitride or silicon carbide.

* * * * *